July 29, 1958 S. D. SILLIMAN ET AL 2,845,548
STATIC TIME DELAY CIRCUIT
Filed April 25, 1956
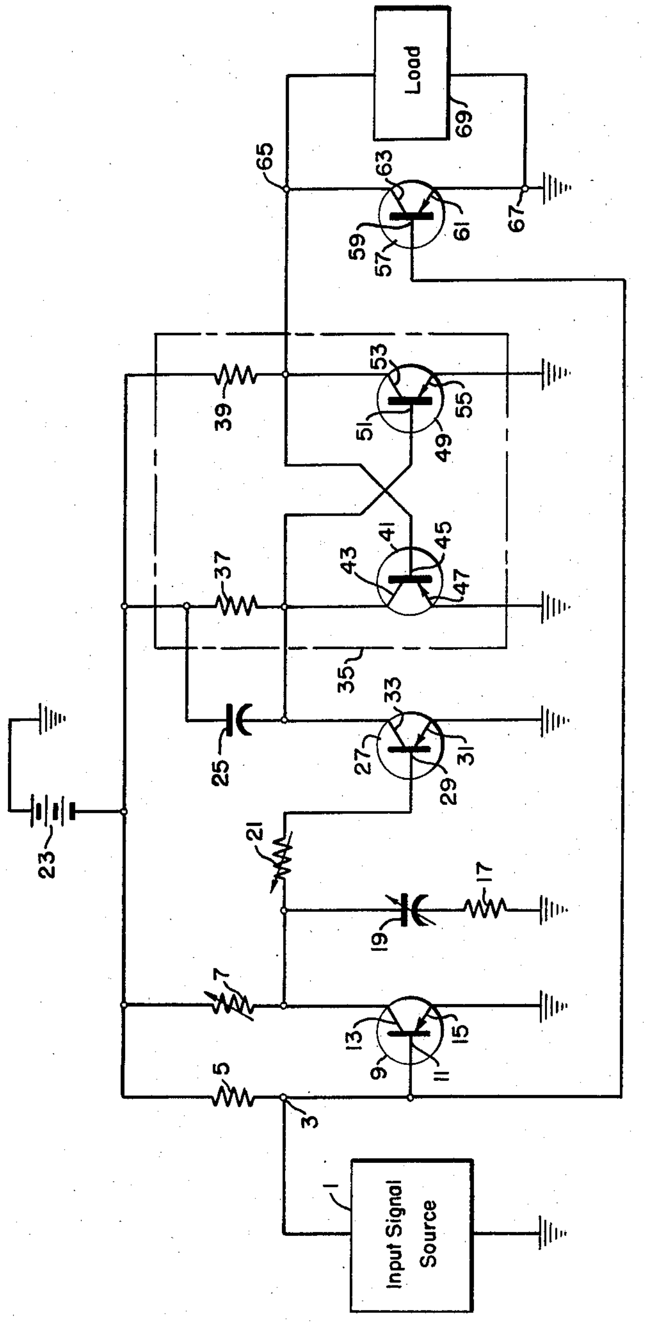
WITNESSES:
Bernard R. Gieguey
Leon J. Taza
INVENTORS
Sheldon D. Silliman and
John F. Reuther.
BY
John B. Davidson
ATTORNEY 2,845,548

STATIC TIME DELAY CIRCUIT

Sheldon D. Silliman and John F. Reuther, Pittsburgh, Pa., assignors to Westinghouse Electric Corporation, East Pittsburgh, Pa., a corporation of Pennsylvania Application April 25, 1956, Serial No. 580,615

8 Claims. (Cl. 307—88.5)

This invention relates to electrical time delay devices and more particularly to time delay devices making use of static circuit components.

Time delay circuitry has become of increasing importance with the advent of electronic computers and supervisory control systems. Inasmuch as such systems make use of great numbers of time delay circuits and such circuits must be housed in compartments of rather small volume, the heating problem assumes considerable magnitude. Prior art devices have required a minimum of several hundred milliwatts of power; even though this amount of power is very small for an individual time delay circuit, it assumes a magnitude that can become troublesome when large members of units are under consideration.

Furthermore, in supervisory control systems the use of but one bias source having a single bias supply voltage is almost mandatory. It is quite inconvenient to supply more than one bias voltage for operation of the time delay circuit. Other considerations that enter into the design of the circuitry are that accurate positive operation must be maintained at all times and that the number of component parts must be kept to an absolute minimum in order to keep the size of the over-all apparatus as small as possible.

Accordingly, one object of this invention is to provide an electrical time delay circuit for a signal having a step-function wave form, having improved operating characteristics.

Another object is to provide a step-function time delay circuit having a single bias voltage supplying the entire circuit.

Still another object is to provide a step-function time delay circuit having a minimum total heat dissipation from the component parts thereof.

A still further object is to provide an electrical time delay circuit utilizing only static, non-thermionic components having a minimum number of component parts.

As one of the elements of this invention, there is utilized a directly coupled multivibrator that toggles from one stable state to the other when a voltage of less than a predetermined magnitude appears between two control terminals thereof and toggles back to the first stable state when the output terminals are short circuited. Such a multivibrator is described in the article "Directly coupled transistor circuits," by R. H. Beter et al., appearing in "Electronics," June 1955, at page 132.

One feature of this invention is the use of a timing circuit including a serially connected resistance-capacitance circuit to toggle a directly coupled bistable multivibrator from one stable state into the other. The directly coupled multivibrator has the characteristic that when its output terminals are short circuited, it will toggle back from the second state into the first. Both the capacitance element in the time circuit and the multivibrator output terminal are normally short circuited. Upon the appearance of an input signal to the time delay both short circuits are removed, and the capacitance element starts charging to toggle the multivibrator to its second stable state after a predetermined time interval, and an output voltage appears at the multivibrator's output terminals. When the input signal is removed, the short circuits are reimposed on the capacitance element and the output terminals of the multivibrator to discharge the capacitance and toggle the multivibrator back to its original stable state.

Other objects and features of this invention will become apparent from a consideration of the following description thereof when taken in connection with the accompanying drawing wherein the single figure is a schematic diagram of a preferred embodiment of the invention.

With reference now to the drawing there is shown a directly coupled multivibrator 35 of the type discussed in the aforementioned article by R. H. Beter et al. This multivibrator comprises two junction type transistors 41 and 49 which are shown as being of the p-n-p type. Emitter to collector bias voltage for the transistors is derived from bias voltage source 23 which is connected to the collectors 43 and 53 of transistors 41 and 49 through resistors 37 and 39, respectively. The base electrode 51 of transistor 49 is directly connected to the collector 43 of transistor 41, and the base electrode 45 of transistor 41 is directly connected to collector 53 of transistor 49. The emitters 47 and 55 are connected to ground as shown. The operation of the multivibrator is described in detail in the aforementioned article and will not be found discussed herein. It should be pointed out, however, that any type of junction transistor has been found to work satisfactorily, satisfactory operation not being confined to the use of surface barrier type junction transistors as intimated in the article.

For the purpose of insuring the initial conduction state of the multivibrator 35, a capacitance element 25, is connected across resistor 37. Thus, when the voltage from source 23 is initially applied to the circuit, the voltage applied to base 51 will rise at a far more rapid rate than the voltage applied to base 45 so that transistor 49 will be rendered conducting initially. The necessity of this requirement will appear below.

The main timing elements for the circuit are provided by a T-connected resistance capacitance circuit across voltage source 23 comprising variable resistor 7, variable resistor 21 and variable capacitor 19. Resistance 17 is a current limiting resistor described below and contributes negligible effect in the time delay circuit under usual operating conditions. The junction point between resistors 7 and 21 is connected to ground through capacitor 19 in series with current limiting resistor 17. This junction point is also connected to the collector electrode 13 of transistor 9. Large changes in time delay are effected by varying capacitor 19 in steps while fine adjustment is provided by varying resistors 7 and 21. The lower limit of resistance value of resistors 7 and 21 is determined by the current carrying capacity of transistors 9 and 27 while the upper limit is determined by the minimum base current required to saturate transistor 27.

Junction transistor 27 is connected in parallel with transistor 41 for the purpose of toggling the multivibrator 35 to the stable state wherein transistor 41 is conducting and transistor 49 is non-conducting when the voltage across capacitor 19 reaches a predetermined value. Emitters 31 and 47 of transistors 27 and 41, respectively, are connected to ground and collectors 33 and 43 are connected together. Base electrode 29 of transistor 27 is connected to timing resistor 21.

A switching transistor 9, which may be of the junction p-n-p type, is provided for the purpose of providing a substantially short circuit across capacitor 19 and discharging the capacitor as required to effect the time delay action. Collector 13 is connected to the junction of resistors 7 and 21 and capacitor 19 while emitter 15 is connected to ground. It will be further noted that the main function of resistor 17 is to limit the current that will flow through transistor 9 when capacitor 19 is discharging through the emitter to collector current conduction path of transistor 9.

An input signal source 1 is connected between base 11 of transistor 9 and ground. Transistor 9 is normally biased to full collector current conduction by bias source 23, the negative electrode of which is connected to base 11 through resistor 5. Signal source 1 is adapted to drive base 11 essentially to ground potential to cut off the transistor.

The output voltage for the over-all circuit is derived across the emitter and collector terminals of transistor 49. When this transistor is cut off, the voltage appearing across output terminals 65 and 67 is the voltage drop from the emitter 47 to the base 45 of transistor 41 caused by the portion of the current in resistor 39 which flows through base 45 of transistor 41. Load 69 is connected to output terminals 65 and 67. The load may be of the input circuit of the following stage or any other suitable device for which time delay must be provided.

For the purpose of triggering multivibrator 35 from the conduction state wherein transistor 49 is non-conducting to the state where it is conducting and transistor 41 is non-conducting, a transistor 57 (shown as being a p-n-p junction type transistor) is connected with its collector terminal 63 connected directly to the output terminal 65 and emitter terminal 61 connected to the output terminal 67, which latter output terminal is further connected to ground. The base electrode 59 of transistor 57 is connected to the base electrode 11 of transistor 9 so that both transistors 57 and 9 are simultaneously made conducting and simultaneously made non-conducting by signal source 1. Transistor 57, when conducting, effectively short circuits base 45 to emitter 47 to toggle the multivibrator 35 to its original conduction condition whereat transistor 41 is cut off and transistor 49 is at saturation.

Let it first be assumed that signal source 1, which is a conduction path to ground, has not appeared and that bias source 23 has been energized. No output voltage will appear across terminals 65, 67 by virtue of the fact that transistor 57 is conducting, aiding transistor 49 in reducing the voltage across the output terminals to a minimum. If the time delay application does not require transistor 57, the initial state condition of no voltage across the output terminals can be effected by adding capacitor 25 described above. Capacitor 19 is completely discharged since transistor 9 effectively short circuits the capacitor.

Assume now that a step signal appears from signal source 1 that is effective to cut off collector current conduction through transistors 9 and 57. Capacitor 19 will begin charging and the current flow through transistor 27 will gradually increase as the voltage across capacitor 19 increases. The voltage between emitter 31 and collector 33 will gradually decrease until a point is reached whereat the current thtrough transistor 49 begins to decrease. At this point there will be a sudden transition in the conduction states of transistors 49 and 41, transistor 49 almost instantly becoming non-conducting so that the output voltage appears across the output terminals 65 and 67. When the signal source output disappears, transistors 9 and 57 will again be rendered conducting to collector current saturation, capacitor 19 will discharge through transistor 9, and transistor 57 will toggle multivibrator 35 back to its original current conducting condition. Terminals 65 and 67 will again be short circuited and substantially zero output voltage will appear thereacross.

It has been found that the heat dissipation of the time delay circuit described above is approximately 20 milliwatts which is a considerable reduction over the known prior art. The entire circuit can be built into a volume of not over 1.75 cubic inches. It will be noted that only a single bias source is needed for the entire circuit and that only one bias voltage need be supplied by the source. The circuit has been found to be entirely reliable in operation and provides accurate positive toggling action.

The following values of the circuit components have been found to be entirely satisfactory in operation although it is to be understood that these values are exemplary only and that other values may be substituted therefor:

| | |
|---|---|
| Resistor **5** | 1000 ohms. |
| Resistor **7** | 6800 ohms. |
| Resistor **17** | 100 ohms. |
| Resistor **21** | 6800 ohms. |
| Resistors **37** and **39** | 1000 ohms. |
| Capacitor **19** | 150 to 1500 microfarad tantalum capacitor. |
| Capacitor **25** | 470 micromicrofarads. |
| Bias source **23** | —3 volt. |
| Transistors **9, 27, 41, 49** and **57** | Type CK–722. |

Although the embodiment disclosed in the preceding specification is preferred, other modifications will be apparent to those skilled in the art which do not depart from the scope of the broadest aspects of the present invention.

We claim as our invention:

1. A step-function time delay circuit comprising: a source of bias potential; a bistable multivibrator including first and second junction transistor means each having at least emitter, base and collector electrodes, the collector of each transistor being directly connected to the base of the other, and first and second impedance means respectively coupling said collector electrodes of said first and second transistor means to said bias source; first capacitor means coupled across said first impedance means to render said second transistor means conducting and said first transistor means nonconducting upon initial energization of said source of bias potential; third impedance means and second capacitor means serially coupled across said source of bias potential; third junction transistor means having emitter and collector electrodes respectively connected to said emitter and base electrodes of said first transistor means; said second capacitor means coupled between the base electrode and said emitter electrode of said third transistor means by fourth impedance means; fourth transistor means having at least emitter, base and collector electrodes, said emitter and collector electrodes of said fourth transistor means being coupled to said second capacitor means to discharge said second capacitor means through the emitter to collector current conduction path of said fourth transistor means; resistor means coupling said bias source between said base and emitter electrodes of said fourth transistor means to render said fourth transistor means normally conducting to collector current saturation; fifth junction transistor means having emitter and collector electrodes respectively connected to said emitter and base electrodes of said second transistor means and base electrode means connected to said base electrode of said fourth transistor means, all of said transistor means being of the same conductivity type; input terminals connected to said base and emitter electrodes of said fourth transistor means, and output terminals connected to said emitter and collector electrodes of said fifth transistor means.

2. A step-function time delay circuit having input terminals and output terminals comprising: a source of bias voltage coupled to said output terminals; a bistable multivibrator coupled to said source of bias potential and to said output terminals adapted to be energized by said bias source; means coupled to said multivibrator adapted to actuate said multivibrator into one of two stable states upon energization of said multivibrator by said bias source, to short circuit said output terminals; serially connected resistor means and capacitor means coupled across said source of bias voltage; first switch means coupling said input terminals to said capacitor means normally short circuiting said capacitor means and adapted to remove said short circuit upon appearance of an input signal at said input terminals; means coupling said capacitor to said multivibrator adapted to trigger said multivibrator into the other of said two stable states when the voltage across said capacitor attains a predetermined magnitude to remove said short circuit across said output terminals, and second switch means coupled across said output terminals and adapted to short circuit said output terminals and return said multivibrator to said one state.

3. A step-function time delay circuit having input terminals and output terminals comprising: a source of bias voltage, first resistor means coupling said source of bias voltage to said output terminals; second resistor means and capacitor means serially connected across said bias source; bistable multivibrator means including said first resistor means coupled to said capacitor and to said output terminals adapted to be triggered from a first stable state to a second stable state by a voltage of predetermined magnitude across said capacitor, said multivibrator short circuiting said output terminals while in said first stable state, and adapted to be returned to said first stable state from said second stable state when said output terminals are short circuited; means coupled to said multivibrator means adapted to trigger said multivibrator into said first stable state upon initial energization thereof by said bias source; first switch means coupled to said input terminals and to said capacitor means adapted to short circuit said capacitor means when no signal appears at said input terminals; second switch means normally short circuiting said output terminals adapted to remove said short circuit when there is an input signal appearing at said input terminals.

4. A step-function time delay circuit having input terminals and output terminals comprising: a source of bias voltage coupled to said output terminals; second resistor means and capacitor means serially connected across said bias source; bistable multivabrator means including said first resistor means coupled to said capacitor and to said output terminals adapted to be triggered from a first stable state to a second stable state by a voltage of predetermined magnitude across said capacitor, said multivibrator short circuiting said output terminals while in said first stable state, and adapted to be returned to said first stable state from said second stable state when said output terminals are short circuited; means coupled to said multivibrator means adapted to trigger said multivibrator into said first stable state upon initial energization thereof by said bias source; first switch means coupled to said input terminals and to said capacitor means adapted to short circuit said capacitor means when no signal appears at said input terminals; second switch means normally short circuiting said output terminals adapted to remove said short circuit when there is an input signal appearing at said input terminals.

5. A step-function time delay circuit having signal input terminals and output terminals comprising: a source of bias potential; bistable multivibrator means including first and second junction transistor means each having at least emitter, base and collector electrodes, the collector of each transistor being directly connected to the base of the other, and first and second impedance means respectively coupling said collector electrodes of said first and second transistor means to said bias source; resistor means and capacitor means serially connected across said bias source; means coupled to said multivibrator means to trigger said multivibrator into a first stable state wherein said first transistor is nonconducting and said second transistor is conducting to collector current saturation; a timing circuit including serially connected resistance means and capacitance means; means coupled to said capacitance means and between said emitter and collector of said first transistor adapted to trigger said multivibrator into a second stable state wherein said first transistor is conducting to collector current saturation and said second transistor is nonconducting when the voltage across said capacitor is greater than a predetermined magnitude; means coupled to said capacitor for short circuiting said capacitor when no signal appears at said input terminals; means responsive to disappearance of said input signal at said input terminals for short circuiting said output terminals and triggering said multivibrator to said first stable state.

6. A step-function time delay circuit having signal input terminals and output terminals comprising: a source of bias potential; bistable multivibrator means including first and second junction transistor means each having at least emitter, base and collector electrodes, the collector of each transistor being directly connected to the base of the other, and first and second impedance means respectively coupling said collector electrodes of said first and second transistor means to said bias source; means coupled to said multivibrator means to trigger said multivibrator into a first stable state wherein said first transistor is nonconducting and said second transistor is conducting to collector current saturation; a timing circuit including serially connected resistance means and capacitance means; means coupled to said capacitance means and between said emitter and collector of said first transistor adapted to trigger said multivibrator into a second stable state wherein said first transistor is conducting to collector current saturation and said second transistor is nonconducting when the voltage across said capacitor is greater than a predetermined magnitude; means coupled to said capacitor for short circuiting said capacitor when no signal appears at said input terminals; third junction transistor means having emitter and collector electrodes respectively connected to said emitter and collector electrodes of said second transistor, and base and said emitter electrodes connected to said input terminals, responsive to disappearance of said input signal at said input terminals for short circuiting said output terminals and triggering said multi-vibrator to said first stable state.

7. A step-function time delay circuit having signal input and output terminals comprising: bistable multivibrator means coupled to said output terminals having a first stable state wherein an output voltage appears across said output terminals and a second stable state wherein no voltage appears across said output terminals, a timing circuit for determining the frequency of shifting of said multivibrator means from a first stable state to a second stable state comprising a serially connected resistor and capacitor connected in parallel circuit relationship with said multivibrator, responsive to a voltage of a given magnitude to toggle from said second state to said first state, and further responsive to short circuiting of said output terminals to toggle said multivibrator from said second state to said first state; switch means normally short-circuiting said timing circuit responsive to an input signal at said input terminals to remove said short circuit; and means normally short circuiting said output terminals responsive to said input signal to remove said short circuit across said output terminals.

8. A step-function time delay circuit having signal input and output terminals comprising: bistable multivibrator means coupled to said output terminals having a first stable state wherein an output voltage appears across said output terminals and a second stable state wherein no voltage appears across said output terminals, a timing circuit including serially connected resistor means and capacitor means for determining the frequency of shifting of said multivibrator means from a first stable state to a second stable state, said multivibrator means being responsive to a voltage of a given magnitude to toggle from said second state to said first state, and further responsive to short circuiting of said output terminals to toggle said multivibrator from said second state to said first state; means normally short circuiting said output terminals and said capacitor means responsive to an input signal at said input terminals to remove said short circuits.

References Cited in the file of this patent

UNITED STATES PATENTS

| | | |
|---|---|---|
| 2,605,306 | Eberhard | July 29, 1952 |
| 2,641,717 | Toth | June 9, 1953 |
| 2,663,800 | Herzog | Dec. 22, 1953 |
| 2,722,649 | Immel et al. | Nov. 1, 1955 |
| 2,747,136 | Herzog | May 22, 1956 |